United States Patent
Lee et al.

(10) Patent No.: US 11,164,964 B2
(45) Date of Patent: Nov. 2, 2021

(54) POWER SEMICONDUCTOR DEVICE AND METHOD OF FABRICATING THE SAME

(71) Applicant: HYUNDAI AUTRON CO., LTD., Seoul (KR)

(72) Inventors: Ju Hwan Lee, Soengnam-si (KR); Hyuk Woo, Incheon (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 95 days.

(21) Appl. No.: 16/171,197

(22) Filed: Oct. 25, 2018

(65) Prior Publication Data
US 2019/0131440 A1 May 2, 2019

(30) Foreign Application Priority Data
Oct. 30, 2017 (KR) .................. 10-2017-0142732

(51) Int. Cl.
*H01L 29/739* (2006.01)
*H01L 29/06* (2006.01)
(Continued)

(52) U.S. Cl.
CPC ...... *H01L 29/7397* (2013.01); *H01L 21/2253* (2013.01); *H01L 21/263* (2013.01);
(Continued)

(58) Field of Classification Search
CPC ............. H01L 29/7395; H01L 29/7396; H01L 29/7397; H01L 29/0615; H01L 29/0619;
(Continued)

(56) References Cited

U.S. PATENT DOCUMENTS

| | | | |
|---|---|---|---|
| 5,573,862 A | 11/1996 | Gualtieri et al. | |
| 2008/0173893 A1* | 7/2008 | Hamaguchi | ......... H01L 29/7397 257/133 |

(Continued)

FOREIGN PATENT DOCUMENTS

| | | |
|---|---|---|
| CN | 102934231 A | 2/2013 |
| CN | 103065962 A | 4/2013 |

(Continued)

OTHER PUBLICATIONS

Office Action issued in corresponding Chinese Patent Application No. 201811259649.X dated Jun. 24, 2021.

*Primary Examiner* — Sue A Purvis
*Assistant Examiner* — Scott Stowe
(74) *Attorney, Agent, or Firm* — Morgan, Lewis & Bockius LLP

(57) ABSTRACT

Provided is a semiconductor device. The device comprises an epitaxial layer that constitutes a part of an active cell region and is doped with impurities of a first conductivity type at a first concentration; a field stop region that is located below the epitaxial layer and doped with impurities of a second conductivity type at a second concentration which are then activated; and a collector region that is located below the field stop region 70 and is doped with impurities of a second conductivity type. The field stop region is formed by repeatedly alternately arranging regions in which the activation of the impurities of the first conductivity type is relatively strong and regions in which the activation of the impurities of the first conductivity type is relatively weak.

8 Claims, 8 Drawing Sheets

(51) Int. Cl.
*H01L 21/225* (2006.01)
*H01L 21/263* (2006.01)
*H01L 21/306* (2006.01)
*H01L 21/324* (2006.01)
*H01L 29/08* (2006.01)
*H01L 29/36* (2006.01)
*H01L 29/66* (2006.01)
*H01L 21/265* (2006.01)

(52) U.S. Cl.
CPC ...... *H01L 21/30625* (2013.01); *H01L 21/324* (2013.01); *H01L 29/0615* (2013.01); *H01L 29/0619* (2013.01); *H01L 29/0696* (2013.01); *H01L 29/0821* (2013.01); *H01L 29/36* (2013.01); *H01L 29/66348* (2013.01); *H01L 21/26513* (2013.01); *H01L 29/7396* (2013.01)

(58) Field of Classification Search
CPC ............. H01L 29/0696; H01L 29/0821; H01L 21/2253; H01L 21/263; H01L 21/30625; H01L 21/324
See application file for complete search history.

(56) References Cited

U.S. PATENT DOCUMENTS

| | | |
|---|---|---|
| 2012/0286324 A1 | 11/2012 | Lee |
| 2014/0234568 A1 | 8/2014 | Tanikella et al. |
| 2017/0271489 A1 | 9/2017 | Kuruc et al. |
| 2018/0173893 A1 | 6/2018 | Rose et al. |

FOREIGN PATENT DOCUMENTS

| | | |
|---|---|---|
| CN | 203871337 U | 10/2014 |
| CN | 104425260 A | 3/2015 |
| CN | 105723525 A | 6/2016 |
| KR | 10-2008-0069501 A | 7/2008 |
| KR | 10-2014-0057630 A | 5/2014 |
| KR | 10-2014-0141572 A | 12/2014 |
| WO | 2016/001182 A2 | 1/2016 |

* cited by examiner

| ITEM | COMPARATIVE EXAMPLE 1 | COMPARATIVE EXAMPLE 2 |
|---|---|---|
| ITEM | THIN BUFFER | THICK BUFFER |
| SHAPE |  |  |
| CONCENTRATION |  |  |
| EFFICIENCY | GOOD | POOR |
| ROBUSTNESS | POOR | GOOD |

| ITEM | COMPARATIVE EXAMPLE 1 | COMPARATIVE EXAMPLE 2 | EMBODIMENT |
|---|---|---|---|
| ITEM | THIN BUFFER | THICK BUFFER | STRUCTURE OF ALTERNATELY ARRANGED STRONG AND WEAK REGIONS |
| SHAPE |  |  |  |
| CONCENTRATION |  | | |
| EFFICIENCY | GOOD | POOR | GOOD |
| ROBUSTNESS | POOR | GOOD | GOOD |

POWER SEMICONDUCTOR DEVICE AND METHOD OF FABRICATING THE SAME

CROSS-REFERENCE TO RELATED APPLICATIONS

This application claims priority to and the benefit of Korean Patent Application No. 10-2017-0142732 filed in the Korean Intellectual Property Office on Oct. 30, 2017, the entire contents of which are incorporated herein by reference.

BACKGROUND

Field

The present invention relates to a power semiconductor device and a manufacturing method thereof, and more particularly, to an insulated gate bipolar transistor (IGBT) device and a manufacturing method thereof.

Related Technology

Insulated gate bipolar transistor (IGBT) is developed through a functional integration of metal-oxide-semiconductor (MOS) technology and bipolar physics. It is characterized by its low saturation voltage and fast-switching capabilities. Its application is expanded to applications that cannot be realized with thyristors, bipolar transistors, MOSFET, etc. It also is a next-generation power semiconductor device that is essentially used in a high-efficiency, high-speed power system widely used in a voltage range of 300 V or higher. Since the development of power MOSFETs in the 1970s, MOSFETs have been used as switching devices in the fields where fast-switching capabilities are required, while bipolar transistors, thyristors, GTOs, etc. have been used in the fields where a large amount of current conduction is required at medium to high voltages. The IGBT, which was developed in the early 1980s, has a better current capability than bipolar transistors in terms of output characteristics and has gate driving characteristics like MOSFETs in terms of input characteristics, and therefore it is capable of switching at a high speed of about 100 KHz. Accordingly, the IGBT is being used in a wide range of applications, from industrial to home electronics since it is used not only for devices to replace MOSFETs, bipolar transistors, and thyristors but also for creating new application systems.

A related prior art is Korean Laid-Open Publication No. 20140057630 (published on May 13, 2014, entitled "IGBT and manufacturing method thereof").

SUMMARY

An object of the present invention is to provide a power semiconductor device capable of improving both efficiency and robustness and a method of fabricating the same. However, these problems are illustrative, and thus the scope of the present invention is not limited thereto.

A power semiconductor device according to an aspect of the present invention for solving the above problems is provided. The power semiconductor device includes an epitaxial layer that constitutes a part of an active cell region and is doped with impurities of a first conductivity type at a first concentration; a field stop region that is located below the epitaxial layer and doped with impurities of a second conductivity type at a second concentration which are then activated; and a collector region that is located below the field stop region and doped with impurities of a second conductivity type, wherein the field stop region is formed by repeatedly alternately arranging regions in which the activation of the impurities of the first conductivity type is relatively strong and regions in which the activation of the impurities of the first conductivity type is relatively weak.

When the power semiconductor device is switched on, a hole current that passes through the regions of the field stop region, in which the activation is relatively weak, is larger than a hole current that passes through the regions of the field stop region, in which the activation relatively strong, and when the power semiconductor device is switched off, a current that passes through the regions of the field stop region, in which the activation is relatively strong, is larger than a current that passes through the regions of the field stop region, in which the activation is relatively weak.

In the power semiconductor device, the second concentration of the impurities of the first conductivity type in the field stop region may be higher than the first concentration of the impurities of the first conductivity type in the epitaxial layer.

In the power semiconductor device, the first conductivity type and the second conductivity type may have opposite conductivity types and may be each one of p-type and n-type.

A method for fabricating a power semiconductor device according to another aspect of the present invention for solving the above problems is provided. The method includes: forming an epitaxial layer that constitutes a part of an active cell region and is doped with impurities of a first conductivity type at a first concentration on a semiconductor wafer; forming a gate structure on the epitaxial layer; removing the semiconductor wafer except for a rim of the semiconductor wafer; forming a field stop region by doping a lower portion of the epitaxial layer with impurities of a first conductivity type at a second concentration and by activating the impurities using a first laser annealing process; and forming a collector region by doping a region of the lower portion of the epitaxial layer below the field stop region with impurities of a second conductivity type and by activating the impurities using a second laser annealing process, wherein the first annealing process is performed such that regions in which the activation of the impurities of the first conductivity type and the second concentration is relatively strong and regions in which the activation of the impurities of the first conductivity type and the second concentration is relatively weak are repeatedly alternately arranged.

A method for fabricating a power semiconductor device according to yet another aspect of the present invention for solving the above problems is provided. The method includes: forming an epitaxial layer that constitutes a part of an active cell region and is doped with impurities of a first conductivity type at a first concentration on a semiconductor wafer; forming a gate structure on the epitaxial layer; removing the semiconductor wafer except for a rim of the semiconductor wafer; forming a collector region by doping a lower portion of the epitaxial layer with impurities of a second conductivity type and by activating the impurities using a second laser annealing process; and forming a field stop region by doping the collector region in the lower portion of the epitaxial layer with impurities of a first conductivity type at a second concentration and by activating the impurities using a first laser annealing process, wherein the first laser annealing process is performed such that regions in which the activation of the impurities of the first conductivity type and the second concentration is relatively strong and regions in which the activation of the impurities of the first conductivity type and the second concentration is relatively weak are repeatedly alternately arranged.

In the method of fabricating a power semiconductor device, the first laser annealing process may be performed in a manner that at least one of the laser energy and the annealing time is differentially applied to the regions in which the activation of the impurities of the first conductivity type is relatively strong and the regions in which the activation of the impurities of the first conductivity type is relatively weak, such that the regions in which the activation of the impurities of the first conductivity type is relatively strong and the regions in which the activation of the impurities of the first conductivity type is relatively weak are repeatedly alternately arranged in the field stop region.

In the method of fabricating a power semiconductor device, removing the semiconductor wafer except for the rim of the semiconductor wafer may include the step of removing using a Tyco process grinding process.

According to embodiments of the present invention as described above, a power semiconductor device and a method of fabricating the same that is capable of improving both efficiency and robustness can be implemented. Of course, the scope of the present invention is not limited by these effects.

EXPLANATION OF REFERENCE NUMERALS

Figure 1:
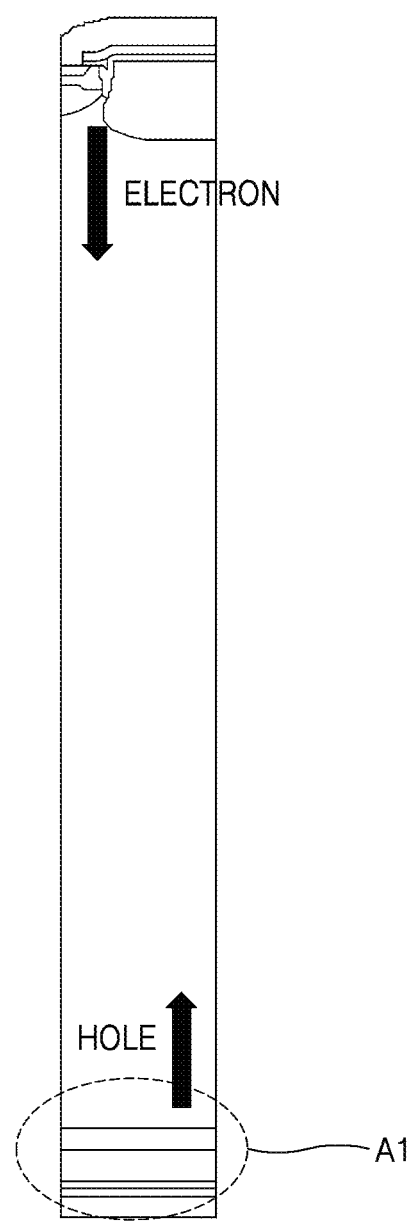
FIG. 1 illustrates a portion of an active cell region of a conventional power semiconductor device.

10: epitaxial layer
70: field stop region as a buffer layer
70a: region in which the activation of the impurities of a first conductivity type is relatively strong
70b: region in which the activation of the impurities of a first conductivity type is relatively weak
71: collector region

DETAILED DESCRIPTION

Hereinafter, embodiments of the present invention will be described in detail with reference to the accompanying drawings. However, it should be understood that the present invention is not limited to the embodiments described below, but may be embodied in various other forms. The following embodiments are intended to give a more complete description of the present disclosure, and are provided in order to fully convey the scope of the disclosure to those skilled in the art. Also, at least some of the components may be exaggerated or reduced in size for convenience of explanation. Like reference numerals refer to like elements throughout the drawings.

In this specification, a first conductivity type and a second conductivity type may have opposite conductivity types, and may be one of n-type and p-type, respectively. For example, the first conductivity type may be of n-type and the second conductivity type may be of p-type, and these conductivity types are illustratively represented in the accompanying drawings. However, the technical idea of the present invention is not limited thereto. For example, the first conductivity type may be of p-type and the second conductivity type may be of n-type.

Figure 2:
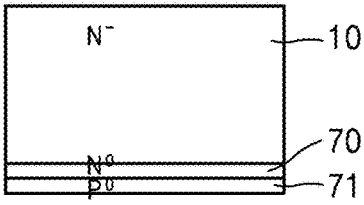
FIG. 2 shows a table illustrating the concentration profile, efficiency and robustness according to the thickness of a field stop region in region A of FIG. 1.
Figure 2:
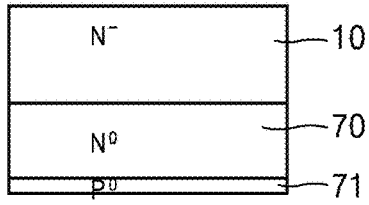
Figure 2:
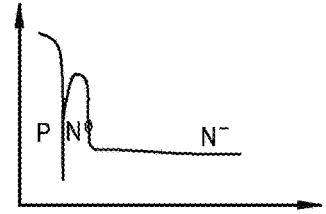
Figure 2:
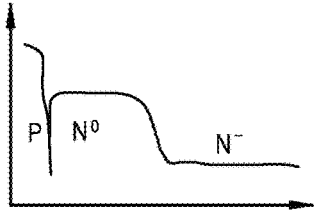
Figure 3:
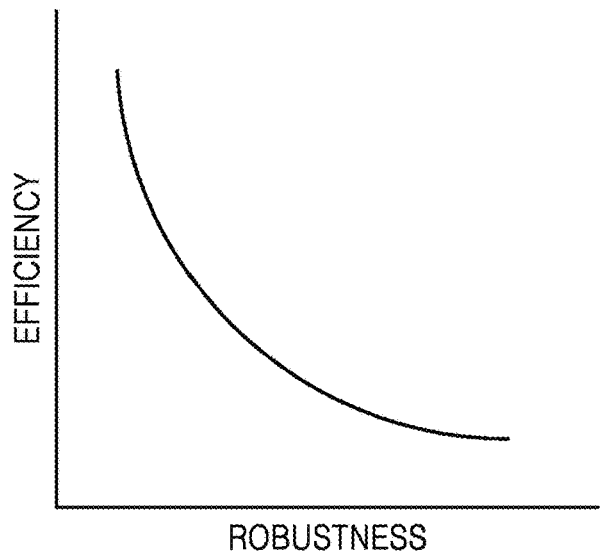
FIG. 3 is a graph showing the relationship between efficiency and robustness in a conventional power semiconductor device.

FIG. 1 illustrates a portion of an active cell region of a conventional power semiconductor device. FIG. 2 shows a table illustrating the concentration profile, efficiency and robustness according to the thickness of a field stop region in region A of FIG. 1. FIG. 3 is a graph showing the relationship between efficiency and robustness in a conventional power semiconductor device.

Referring to FIGS. 1 to 3, a power semiconductor device includes an epitaxial layer 10 that constitutes a part of an active cell region and is doped with impurities of a first conductivity type at a first concentration, a field stop region 70 that is located below the epitaxial layer 10 and doped with impurities of a first conductivity type at a second concentration which are then activated, and a collector region 71 that is located below the field stop region 70 and is doped with impurities of a second conductivity type. Here, the field stop region 70 can be understood as a buffer layer.

If the thickness of the field stop region 70 is relatively small, the upward current by holes during switching on is relatively high and therefore the switching speed (efficiency) is good. However, there is a problem that the downward OFF current by electrons during switching off is relatively low and therefore the robustness is poor.

Meanwhile, if the thickness of the field stop region 70 is relatively large, the downward OFF current by electrons during switching off is relatively high and therefore the robustness is good. However, there is a problem that the upward current by holes during switching on is relatively low and therefore the switching speed (efficiency) is poor.

Thus, power semiconductor devices usually have a trade-off between the efficiency and the robustness.

Figure 4A:
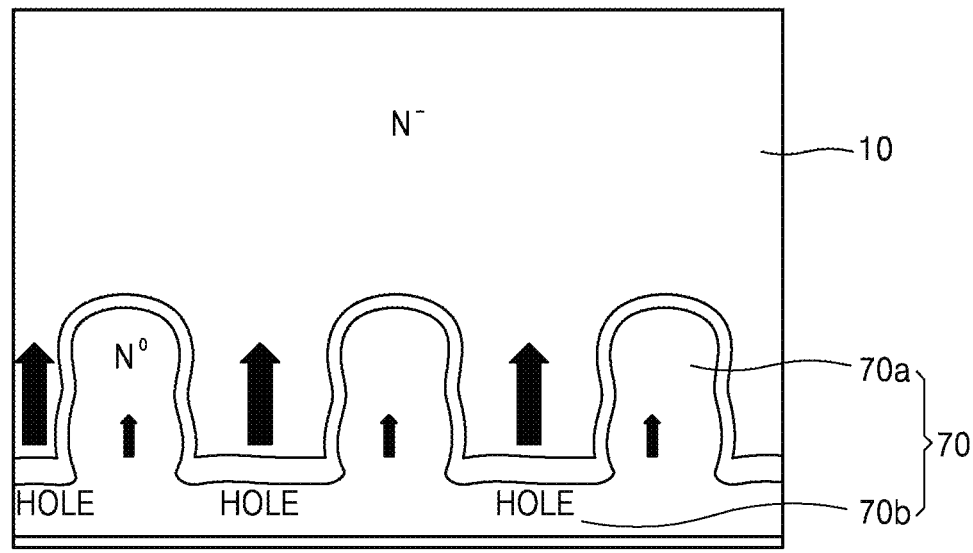
FIGS. 4A and 4B illustrate the efficiency and robustness in a power semiconductor device according to an embodiment of the present invention.
Figure 4B:
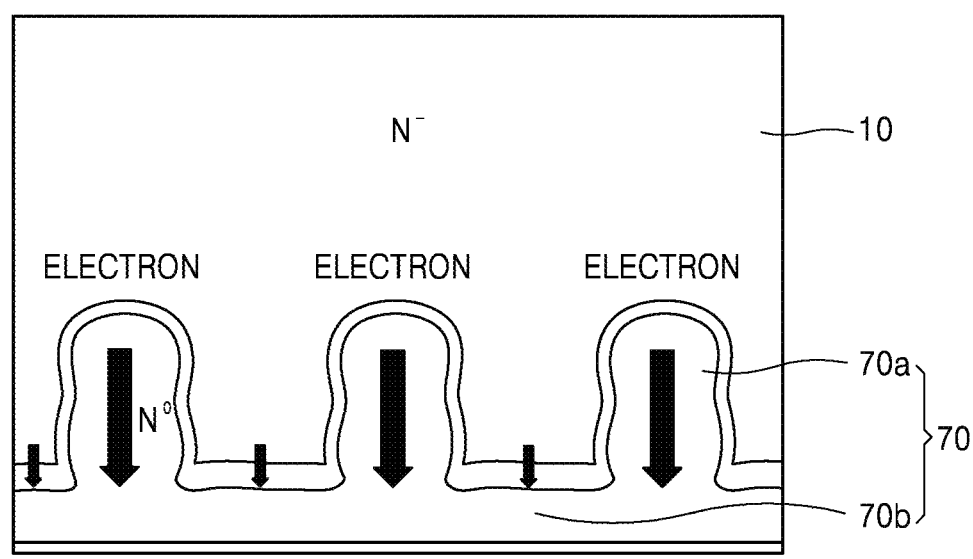

FIGS. 4A and 4B illustrate the efficiency and robustness in a power semiconductor device according to an embodiment of the present invention.

A power semiconductor device according to an embodiment of the present invention includes an epitaxial layer 10 that constitutes a part of an active cell region and is doped with impurities of a first conductivity type at a first concentration and a field stop region 70 that is located below the epitaxial layer 10 and doped with impurities of a first conductivity type at a second concentration which are then activated.

The field stop region 70 is formed by repeatedly alternately arranging regions 70a in which the activation of the impurities of the first conductivity type is relatively strong and regions 70b in which the activation of the impurities of the first conductivity type is relatively weak. For example, the regions 70a and 70b can be arranged alternately while being connected to each other in the direction parallel to the upper surface of the epitaxial layer 10. In other respects, the region 70a, in which the activation of the impurities of the first conductivity type is relatively strong, may be longer than the region 70b, in which the activation of the impurities of the first conductivity type is relatively weak, along the depth direction (vertical direction in the drawing) of the power semiconductor device.

Referring to FIG. 4A, when the power semiconductor device according to the embodiment of the present invention is switched on, a hole current that passes through the region 70b of the field stop region, in which the activation is relatively weak, is larger than a hole current that passes the region 70a of the field stop region 70, in which the activation is relatively strong, thereby ensuring an increase in efficiency through the low activation region.

Referring to FIG. 4B, when the power semiconductor device according to the embodiment of the present invention is switched off, an electron current that passes through the region 70a of the field stop region 70, in which the activation is relatively strong, is larger than an electron current that passes through the region 70b, in which the activation is relatively weak, so that the OFF current effectively flows through the high activation region and therefore robustness is secured.

Therefore, the power semiconductor device according to the embodiment of the present invention has an advantageous effect that the efficiency and robustness can be secured at the same time, with the field stop region 70 formed by repeatedly alternately arranging regions 70a in which the activation of the impurities of the first conductivity type is relatively strong and regions 70b in which the activation of the impurities of the first conductivity type is relatively weak.

Figure 5:
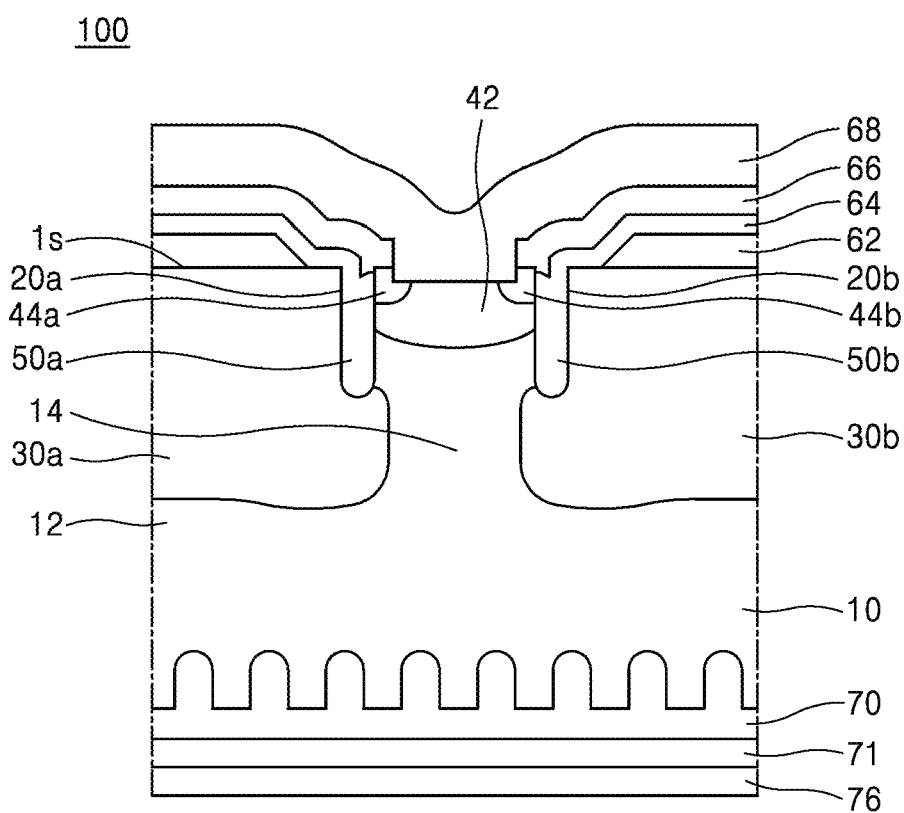
FIG. 5 is a cross-sectional view of an active cell region in a power semiconductor device in accordance with an embodiment of the invention.

FIG. 5 is a cross-sectional view of an active cell region in a power semiconductor device in accordance with an embodiment of the invention.

Referring to FIG. 5, an power semiconductor device 100 according to an embodiment of the present invention includes an epitaxial layer 10 that constitutes a part of an active cell region and is doped with impurities of a first conductivity type at a first concentration, a field stop region 70 that is located below the epitaxial layer 10 and doped with impurities of a first conductivity type at a second concentration which are then activated, and a collector region 71 that is located below the field stop region 70 and is doped with impurities of a second conductivity type. The field stop region 70 is formed by repeatedly alternately arranging regions in which the activation of the impurities of the first conductivity type is relatively strong and regions in which the activation of the impurities of the first conductivity type is relatively weak.

The epitaxial layer 10, as a substrate, may be understood to include an epitaxial layer that is epitaxially grown on a semiconductor wafer. The semiconductor wafer may include, for example, a semiconductor wafer lightly doped with impurities of a first conductivity type. The doping concentration of the n-type impurity in the semiconductor wafer may be, for example, about $10^{13}/cm^3$ to about $10^{16}/cm^3$. Considering the doping concentration of the n-type impurity, the substrate 10 that includes an epitaxially grown epitaxial layer can be referred to as an N-substrate. However, the material and the doping concentration of the substrate 10 are not limited thereto but may vary. The active cell region includes a region in which a plurality of active cells is disposed and current conduction occurs in the vertical direction.

A field stop region 70 is provided as a buffer layer on the lower surface opposite to the upper surface of the epitaxial layer 10. The field stop region 70 may be a region doped with impurities of a first conductivity type. For example, the n-type impurity concentration in the field stop region 70 may be about $10^{14}/cm^3$ to $10^{18}/cm^3$. Considering the n-type impurity concentration in the field stop region 70, the field stop region 70 can be referred to as a N0 layer. The n-type impurity concentration in the field stop region 70 may be higher than the n-type impurity concentration in the substrate 10 that includes the epitaxially grown epitaxial layer. A collector region 71 may be provided below the field stop region 70. The collector region 71 may be a region doped with impurities of a second conductivity type, for example, p-type impurities. Meanwhile, a second metal film 76 may be further provided below the collector region 70. The second metal film 76 may be provided as a collector electrode.

Furthermore, the illustrative elements that constitute the power semiconductor device 100 according to an embodiment of the present invention will be described below. It should be understood, however, that these illustrative elements are not provided to limit the technical idea of the present invention but are provided as an explanation for understanding the configuration of a power semiconductor device.

A power semiconductor device 100 according to an embodiment of the present invention includes a pair of gate electrodes 50a and 50b disposed in a first trench 20a and a second trench 20b, respectively, which are spaced apart from each other in the epitaxial layer 10. Here, the epitaxial layer 10 can be understood to include an epitaxial layer that is epitaxially grown on the wafer.

A power semiconductor device 100 according to an embodiment of the present invention includes a body region 42 having a second conductivity type disposed between the first trench 20a and the second trench 20b and a pair of source regions 44a and 44b having a first conductivity type that are spaced apart from each other and disposed adjacent to the first trench 20a and the second trench 20b, respectively, in the body region 42.

The power semiconductor device 100 according to an embodiment of the present invention includes a floating region 30a having a second conductivity type that surrounds the bottom surface and at least one side surface of the first trench 20a and a floating region 30b having a second conductivity type that surrounds the bottom surface and at least one side surface of the second trench 20b. A pair of the floating regions 30a and 30b having a second conductivity type may be spaced apart from each other. The depth to the bottom surfaces of the floating regions 30a and 30b with respect to the top surface is of the epitaxial layer 10 as a substrate is larger than the depth to the bottom surfaces of the first trench 20a and the second trench 20b. That is, the maximum doping depth of the floating regions 30a and 30b having a second conductivity type may be larger than the depth of the first trench 20a and the second trench 20b.

The power semiconductor device 100 according to an embodiment of the present invention includes a drift region having a first conductivity type that extends from below a pair of floating regions 30a and 30b having a second conductivity type through a region 14 between the pair of floating regions 30a and 30b having a second conductivity type to the body region 42 of a second conductivity type.

Meanwhile, the maximum doping depth of the body region 42 having a second conductivity type is smaller than the depths of the first trench 20a and the second trench 20b, and the maximum doping depth of the floating regions 30a and 30b having a second conductivity type may be larger than the depths of the first trench 20a and the second trench 20b.

A conductive pattern 64 electrically connected to the gate electrodes 50a and 50b and a conductive pattern 68 electrically connected to the source regions 44a and 44b and the body region 42 are disposed on the substrate. The conductive patterns 64 and 68 function as electrodes or contacts and can be electrically insulated with insulating patterns 62 and 66 interposed therebetween. Meanwhile, a collector electrode 76 may be disposed under the substrate.

Hereinafter, a method of fabricating a power semiconductor device according to an embodiment of the present invention will be described.

FIGS. 6A to 6C and FIGS. 7A to 7D respectively illustrate parts of a process of manufacturing a power semiconductor device according to an embodiment of the present invention. The power semiconductor device shown in FIG. 6A corresponds to a state before a laser annealing process is applied, and the power semiconductor device shown in FIG. 7A corresponds to a state after the laser annealing process is applied.

Figure 7A:
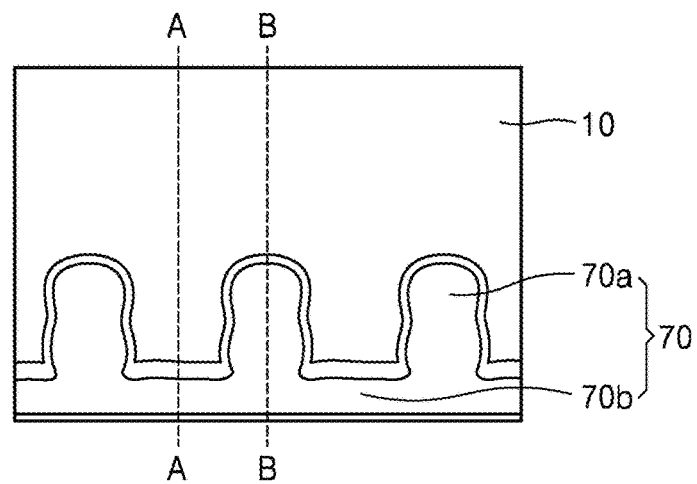
Figure 7B:
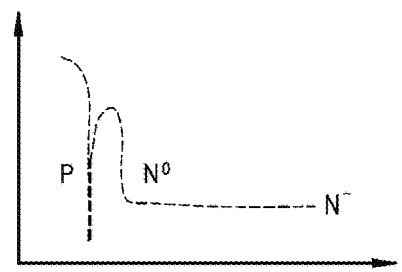
Figure 7C:
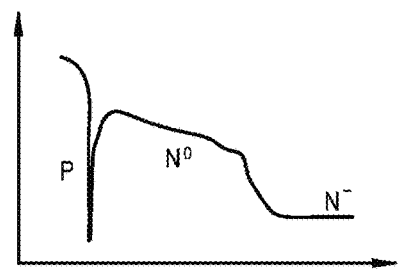
Figure 7D:

FIG. 7B is a graph showing a doping concentration profile in a cross section taken along line A-A in the power semiconductor device shown in FIG. 7A, FIG. 7C is a graph showing a doping concentration profile in a cross section taken along line B-B in the power semiconductor device shown in FIG. 7A, and FIG. 7D is a graph showing an electric field profile in the power semiconductor device shown in FIG. 7A.

According to an aspect of the present invention, a method of fabricating a power semiconductor device includes: forming an epitaxial layer that constitutes a part of an active cell region and is doped with impurities of a first conductivity type at a first concentration on a semiconductor wafer 200; forming a gate structure on the epitaxial layer; removing the semiconductor wafer 200 except for a rim 250 of the semiconductor wafer; forming a field stop region by doping a lower portion of the epitaxial layer with impurities of a first conductivity type at a second concentration and by activating the impurities using a first laser annealing process; and forming a collector region by doping a region of the lower portion of the epitaxial layer below the field stop region with impurities of a second conductivity type and by activating the impurities using a second laser annealing process. Meanwhile, the first annealing process is performed such that regions in which the activation of the impurities of the first conductivity type and the second concentration is relatively strong and regions in which the activation of the impurities of the first conductivity type and the second concentration is relatively weak are repeatedly alternately arranged. Here, the field stop region is formed before the collector region.

According to another aspect of the present invention, a method of fabricating a power semiconductor device includes: forming an epitaxial layer that constitutes a part of an active cell region and is doped with impurities of a first conductivity type at a first concentration on a semiconductor wafer 200; forming a gate structure on the epitaxial layer; removing the semiconductor wafer 200 except for a rim 250 of the semiconductor wafer; forming a collector region by doping a lower portion of the epitaxial layer with impurities of a second conductivity type and by activating the impurities using a second laser annealing process; and forming a field stop region by doping the collector region in the lower portion of the epitaxial layer with impurities of a first conductivity type at a second concentration and by activating the impurities using a first laser annealing process. Meanwhile, the first annealing process is performed such that regions in which the activation of the impurities of the first conductivity type and the second concentration is relatively strong and regions in which the activation of the impurities of the first conductivity type and the second concentration is relatively weak are repeatedly alternately arranged. Here, the collector region is formed before the field stop region.

Here, the semiconductor wafer 200 may include, for example, a semiconductor wafer lightly doped with impurities of a first conductivity type. The doping concentration of the n-type impurity in the semiconductor wafer may be, for example, about $10^{13}/cm^3$ to about $10^{16}/cm^3$. Considering the doping concentration of the n-type impurity, the substrate that includes an epitaxially grown epitaxial layer can be referred to as an N-substrate.

The thickness of the semiconductor wafer 200 is relatively thick and therefore it is inefficient to form a field stop region and a collector region by doping the lower surface of the epitaxial layer with impurities through the rear surface of the semiconductor wafer 200 and then activating the impurities. Therefore, it is necessary to reduce the thickness of at least a part of the rear surface of the semiconductor wafer 200 before forming the field stop region and the collector region. Such a removal process may include a thinning process using an etching process or a grinding process. However, if the thinning process is applied over the entire area of the semiconductor wafer 200, a problem may arise in that a bend occurs and handling of the subsequent process is not easy. Thus, it is advantageous to remove the central portion of the semiconductor wafer 200 except for a predetermined thickness or more of the rim 250 so that the epitaxial layer is exposed. For example, the step of removing the portion of the semiconductor wafer except for the rim may include a step of removing using a Tyco process grinding process.

Under such a structure, differentiating the impurity doping concentration accompanies a photolithography process and therefore is not practically easy for a method for differentiating the degree of impurity activation in the field stop region on the lower surface of the epitaxial layer.

Figure 6A:
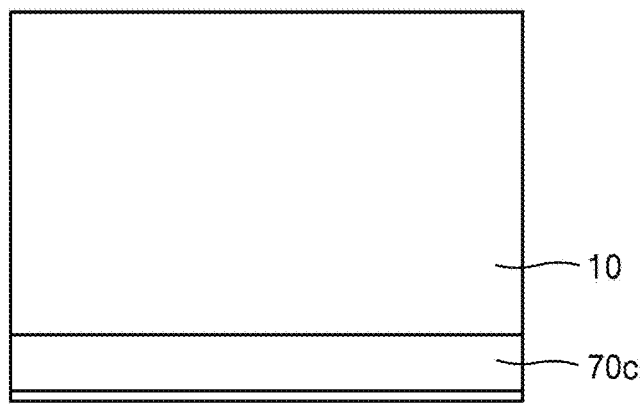
FIGS. 6A to 6C and FIGS. 7A to 7D respectively illustrate parts of a process of manufacturing a power semiconductor device according to an embodiment of the present invention.
Figure 6B:
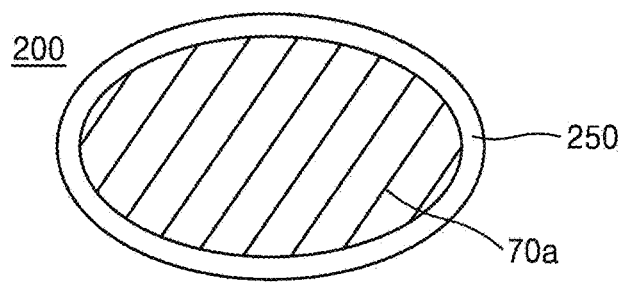
Figure 6C:
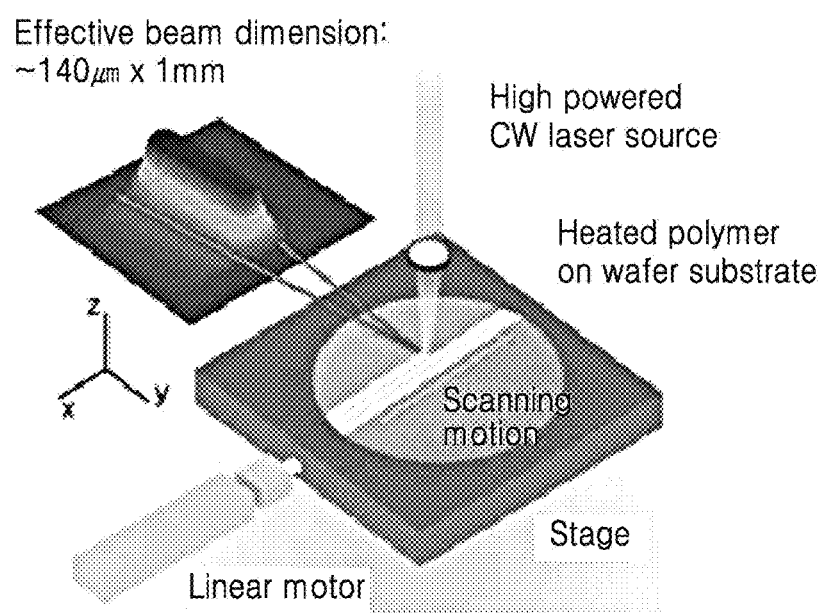

Therefore, the doping concentration of the impurities implanted to form the field stop region is equally applied across the active cell region, and the laser annealing process shown in FIG. 6C as an annealing process is performed differentially in the first region 70a and the second region 70b as the annealing process for the preliminary field stop region 70c into which the impurities are implanted, thereby forming the field stop region 70. The resulting field stop region 70 is formed in such a manner that regions 70a in which the activation of the doped impurities is relatively strong and regions 70b in which the activation of the doped impurities is relatively weak are repeatedly alternately arranged. The method of differentiating the laser annealing process may be performed such that at least one of the laser energy and the annealing time is differentially applied to the first regions 70a and the second regions 70b.

For example, the low activation region, which is the second region 70b in the field stop region 70 of the power semiconductor device, may be subjected to a laser annealing process such that at least one of the laser energy and the annealing time is relatively small or short compared with the high activation region, which is the first region 70a in the field stop region 70 of the power semiconductor device.

Figure 8A:
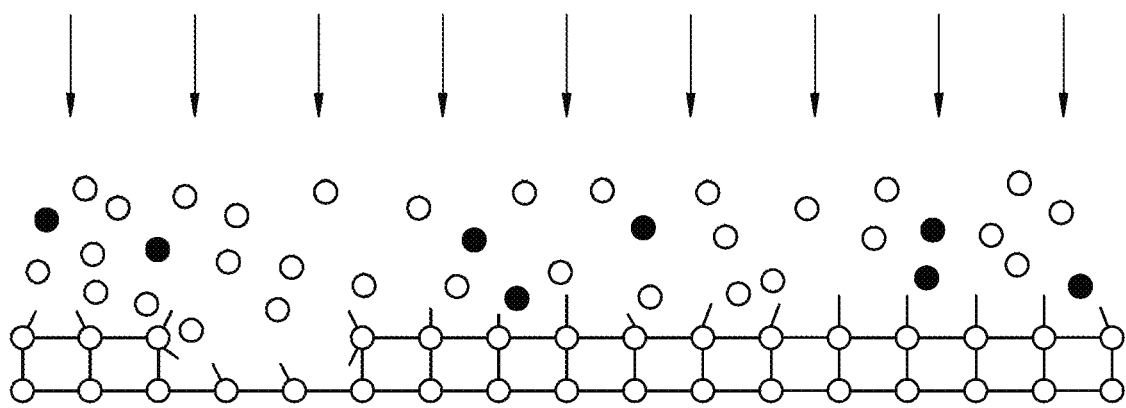
FIGS. 8A and 8B illustrate the lattice changes due to activation according to an ion implantation process and a subsequent annealing process.
Figure 8B:
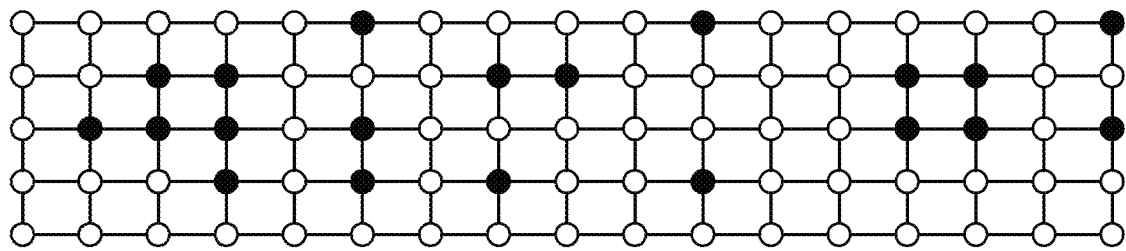

FIGS. 8A and 8B illustrate the lattice changes due to activation according to an ion implantation process and a subsequent annealing process.

Referring to FIGS. 8A and 8B, it can be seen that the lattice breaks while the dopant ions, which are represented by •, are implanted, and that the broken lattice is recovered through the laser annealing process and the carrier dopant ions are activated.

The technical idea of the present invention has been described above with reference to embodiments and comparative examples.

Figure 9:
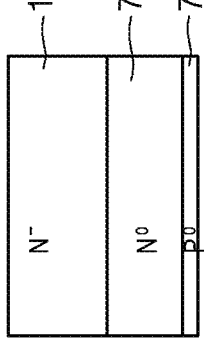
FIG. 9 shows a table summarizing the buffer layer structure, the impurity concentration profile, the efficiency and the robustness in the power semiconductor device according to an embodiment of the present invention and comparative examples.
Figure 9:
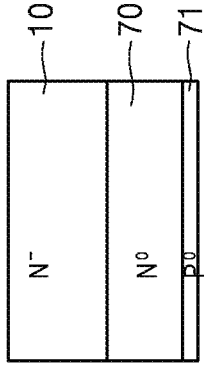
Figure 9:
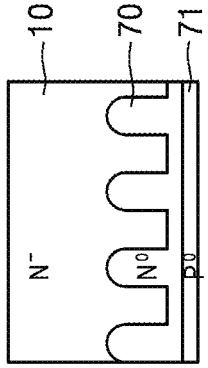
Figure 9:
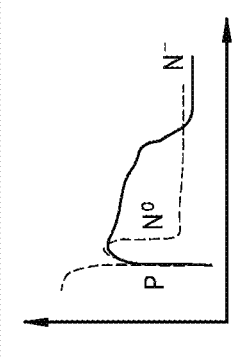

FIG. 9 shows a table summarizing the buffer layer structure, the impurity concentration profile, the efficiency and the robustness in the power semiconductor device according to an embodiment of the present invention and comparative examples.

Referring to FIG. 9, a power semiconductor device includes an epitaxial layer 10 that constitutes a part of an active cell region and is doped with impurities of a first conductivity type at a first concentration, a field stop region 70 that is located below the epitaxial layer 10 and doped with impurities of a first conductivity type at a second concentration which are then activated, and a collector region 71 that is located below the field stop region 70 and is doped with impurities of a second conductivity type. Here, the field stop region 70 can be understood as a buffer layer.

As in Comparative Example 1, if the thickness of the field stop region 70 is relatively small, the upward current by holes during switching on is relatively high and therefore the switching speed (efficiency) is good. However, there is a problem that the downward OFF current by electrons during switching off is relatively low and therefore the robustness is poor.

As in Comparative Example 2, if the thickness of the field stop region 70 is relatively large, the downward OFF current by electrons during switching off is relatively high and therefore the robustness is good. However, there is a problem that the upward current by holes during switching on is relatively low and therefore the switching speed (efficiency) is poor.

On the other hand, in the embodiment of the present invention, the field stop region 70 has a structure of alternately arranged strong and weak regions. That is, regions in which the activation of the doped impurities of the first conductivity type is relatively strong and regions in which the activation of the doped impurities of the first conductivity type is relatively weak are repeatedly alternately arranged. It was confirmed that, in this structure, the downward OFF current by electrons during switching off is relatively high and therefore the robustness is good, and that the upward current by holes during switching on is relatively high and therefore the switching speed (efficiency) is good.

While the present invention has been described with reference to embodiments, it is to be understood that the invention is not limited to the disclosed embodiments, but, on the contrary, is intended to cover various modifications and equivalent arrangements included within the spirit and scope of the appended claims. Therefore, the true scope of the present invention should be determined by the technical idea of the appended claims.

What is claimed is:

1. A power semiconductor device comprising:
    an epitaxial layer that constitutes a part of an active cell region and is doped with impurities of a first conductivity type at a first concentration;
    a field stop region that is located below the epitaxial layer and doped with impurities of a first conductivity type at a second concentration which are then activated; and
    a collector region that is located below the field stop region and doped with impurities of a second conductivity type,
    wherein the field stop region is formed by repeatedly alternately arranging first regions in which the activation of the impurities of the first conductivity type is relatively strong and second regions in which the activation of the impurities of the first conductivity type is relatively weak, and
    wherein the second regions are located on the collector region and adjacent second regions among the second regions are directly connected to each other on the collector region.

2. The device of claim 1,
    wherein when the power semiconductor device is switched on, a hole current that passes through the second regions of the field stop region, in which the activation is relatively weak, is larger than a hole current that passes through the first regions of the field stop region, in which the activation relatively strong, and
    wherein when the power semiconductor device is switched off, a current that passes through the first regions of the field stop region, in which the activation is relatively strong, is larger than a current that passes through the second regions of the field stop region, in which the activation is relatively weak.

3. The device of claim 1,
    wherein the second concentration of the impurities of the first conductivity type in the field stop region is higher than the first concentration of the impurities of the first conductivity type in the epitaxial layer.

4. The device of claim 1,
    wherein the first conductivity type and the second conductivity type have opposite conductivity types and are each one of p-type and n-type.

5. A method for fabricating a power semiconductor device, the method comprising:
    forming an epitaxial layer that constitutes a part of an active cell region and is doped with impurities of a first conductivity type at a first concentration on a semiconductor wafer;
    forming a gate structure on the epitaxial layer;
    removing the semiconductor wafer except for a rim of the semiconductor wafer;
    forming a field stop region by doping a lower portion of the epitaxial layer with impurities of a first conductivity type at a second concentration and by activating the impurities using a first laser annealing process; and
    forming a collector region by doping a region of the lower portion of the epitaxial layer below the field stop region with impurities of a second conductivity type and by activating the impurities using a second laser annealing process,
    wherein the first annealing process is performed such that regions in which the activation of the impurities of the first conductivity type and the second concentration is relatively strong and regions in which the activation of the impurities of the first conductivity type and the second concentration is relatively weak are repeatedly alternately arranged.

6. A method for fabricating a power semiconductor device, the method comprising:

forming an epitaxial layer that constitutes a part of an active cell region and is doped with impurities of a first conductivity type at a first concentration on a semiconductor wafer;

forming a gate structure on the epitaxial layer;

removing the semiconductor wafer except for a rim of the semiconductor wafer;

forming a collector region by doping a lower portion of the epitaxial layer with impurities of a second conductivity type and by activating the impurities using a second laser annealing process; and forming a field stop region by doping the collector region in the lower portion of the epitaxial layer with impurities of a first conductivity type at a second concentration and by activating the impurities using a first laser annealing process, wherein the first laser annealing process is performed such that regions in which the activation of the impurities of the first conductivity type and the second concentration is relatively strong and regions in which the activation of the impurities of the first conductivity type and the second concentration is relatively weak are repeatedly alternately arranged.

7. The device of claim 5, wherein the first laser annealing process is performed in a manner that at least one of the laser energy and the annealing time is differentially applied to the regions in which the activation of the impurities of the first conductivity type is relatively strong and the regions in which the activation of the impurities of the first conductivity type is relatively weak, such that the regions in which the activation of the impurities of the first conductivity type is relatively strong and the regions in which the activation of the impurities of the first conductivity type is relatively weak are repeatedly alternately arranged in the field stop region.

8. The device of claim 6, wherein the first laser annealing process is performed in a manner that at least one of the laser energy and the annealing time is differentially applied to the regions in which the activation of the impurities of the first conductivity type is relatively strong and the regions in which the activation of the impurities of the first conductivity type is relatively weak, such that the regions in which the activation of the impurities of the first conductivity type is relatively strong and the regions in which the activation of the impurities of the first conductivity type is relatively weak are repeatedly alternately arranged in the field stop region.

* * * * *